(12) United States Patent
Kallmann et al.

(10) Patent No.: US 7,136,590 B2
(45) Date of Patent: Nov. 14, 2006

(54) SELF-ADJUSTABLE TUNABLE FILTER

(75) Inventors: Ulrich Kallmann, Tubingen (DE); Wolf Steffens, Herrenberg (DE)

(73) Assignee: Agilent Technologies, Inc., Palo Alto, CA (US)

( * ) Notice: Subject to any disclaimer, the term of this patent is extended or adjusted under 35 U.S.C. 154(b) by 714 days.

(21) Appl. No.: 10/225,038

(22) Filed: Aug. 21, 2002

(65) Prior Publication Data

US 2003/0067663 A1    Apr. 10, 2003

(30) Foreign Application Priority Data

Oct. 6, 2001    (EP) ................... 01123930

(51) Int. Cl.
*H04J 14/02*    (2006.01)

(52) U.S. Cl. .................. 398/85; 398/79; 398/82; 398/83; 398/84; 398/87; 398/182; 398/183; 398/192; 398/193; 398/194; 398/195; 398/196; 398/197; 398/198; 385/24; 385/37; 385/40; 385/3; 385/12

(58) Field of Classification Search .......... 398/182, 398/183, 192, 193, 194, 195, 196, 197, 198, 398/82, 84, 85, 87, 79, 83; 385/12, 3, 37, 385/40, 24

See application file for complete search history.

(56) References Cited

U.S. PATENT DOCUMENTS

| 5,285,059 A | 2/1994 | Nakata et al. | 250/205 |
| 5,552,919 A | 9/1996 | Majima et al. | 359/161 |
| 5,828,689 A | 10/1998 | Epworth | 372/98 |
| 6,674,936 B1 * | 1/2004 | Jacobowitz et al. | 385/24 |

FOREIGN PATENT DOCUMENTS

| EP | 0930741 A2 | 7/1999 |
| WO | WO 01/35138 A1 | 5/2001 |

OTHER PUBLICATIONS

"Automatic Laser Tracking Filter—ALTF", Micron Optics, Inc., 2001 Test Instruments Brochure, attached to the 2002 updated version.

* cited by examiner

*Primary Examiner*—Hanh Phan

(57) ABSTRACT

A system for matching a optical filter characteristic of a first filter tunable in wavelength with an optical first signal comprises a modulator for modulating at least a part of the first signal with a modulation signal before being applied to the first filter. An analyzing unit derives a control signal for tuning the first filter by analyzing the modulated first signal after passing the first filter in conjunction with the modulation signal.

11 Claims, 4 Drawing Sheets

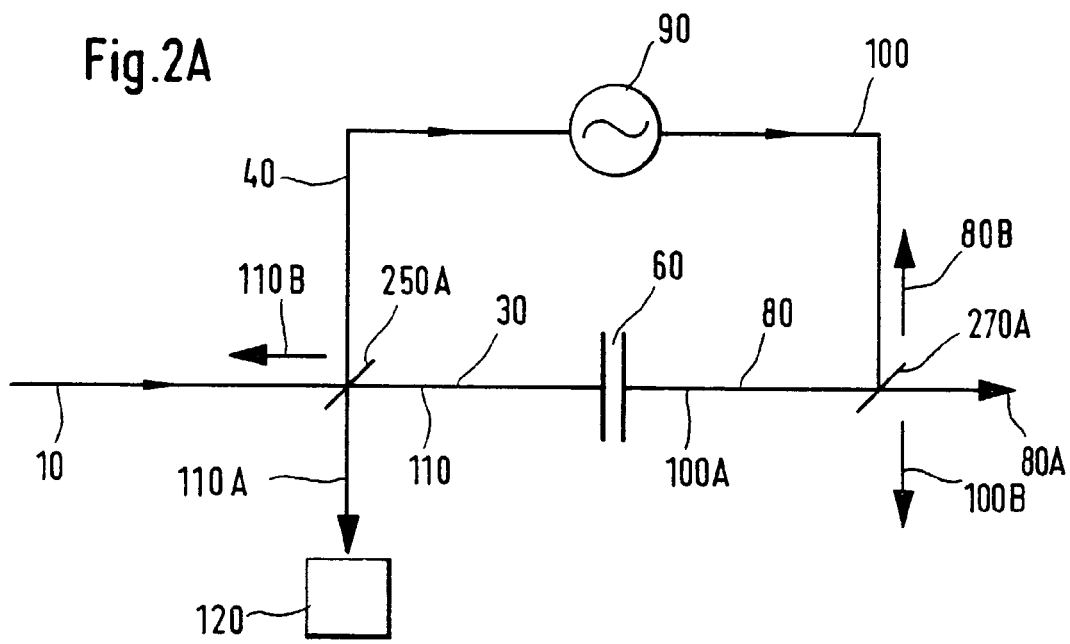
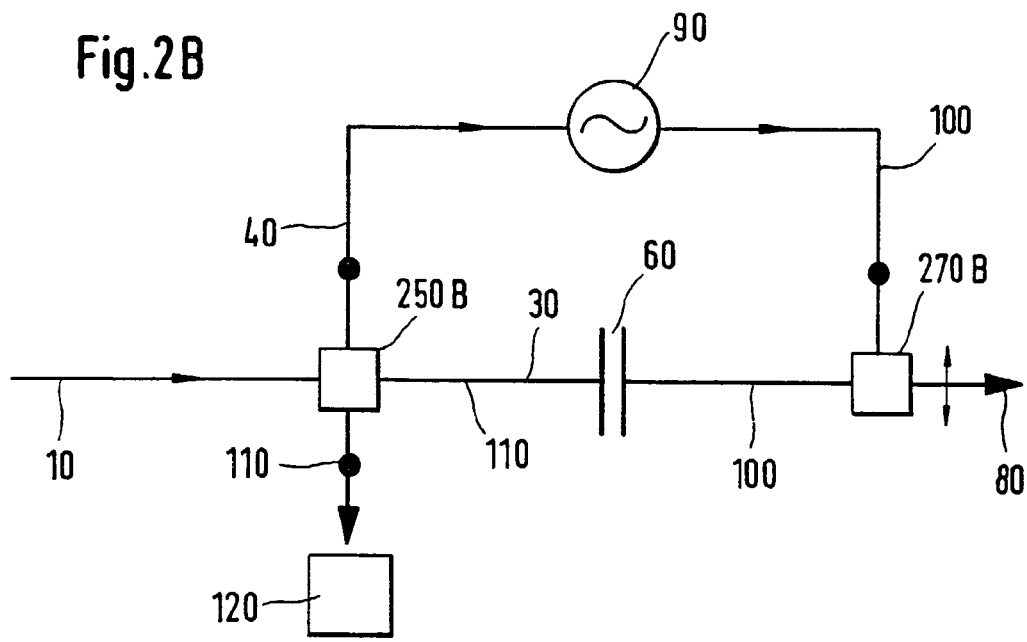

SELF-ADJUSTABLE TUNABLE FILTER

BACKGROUND OF THE INVENTION

The present invention relates to tunable filters.

Tunable filters, such as Fiber Fabry-Perot tunable filters (FFP-TFs), can be used in connection with laser sources e.g. for suppressing source spontaneous emission (SSE) noise representing an undesired optical power in parts of the spectrum other than the lasing frequency itself. However, the central wavelength in transmission spectrum of the tunable filter must well match with the wavelength of the laser signal in order not to unduly decrease optical power of the laser signal. The filter is therefore tuned in wavelength to ensure that the maximum of the tunable filter pass band is fixed to the frequency of the peak lasing intensity.

Beside an initial adjustment of the filter maximum to the laser peak frequency, a continues adjustment might be required in order to correct for mismatches between filter and laser caused e.g. by tuning the laser frequency, thermal variations in the filter, or frequency drift in the laser.

In U.S. Pat. No. 5,552,919, the central wavelength in the transmission spectrum of the tunable filter is periodically and minutely modulated. An error signal is generated for use in tracking the central wavelength of the filter to the wavelength of the laser by analyzing the modulated filter output.

Although no details of an "Automatic Laser Tracking Filter—ALTF", as published by Micron Optics, Inc. in its "2001 Test Instruments" brochure, see http://www.micron-optics.com/altf.htm, are disclosed, it appears that the ALTF makes use of the same principle as disclosed in the aforementioned U.S. Pat. No. 5,552,919, i.e. dithering the filter characteristics for deriving a control signal to displace the filter characteristics. After passing the tunable filter, a small fraction of the optical power is tapped off and sent to a detector. The electrical signal from the detector is fed to a scan and lock circuitry. A phase lock loop (PLL) ensures that the maximum of the tunable filter pass band is fixed to the frequency of peak lasing intensity.

SUMMARY OF THE INVENTION

It is an object of the present invention to provide an improved adjustment for tunable filters. The object is solved by the independent claims. Preferred embodiments are shown by the dependent claims.

According to the present invention for matching an optical filter characteristic of an (optical) first filter tunable in wavelength with a first optical signal, at least a part of the first optical signal is modulated with a modulation signal before being applied to the first filter. For deriving a control signal for tuning the first filter, the modulated first optical signal after passing the first filter is analyzed in conjunction with the modulation signal. Thus, instead of modulating or dithering a filter characteristic as provided by the aforementioned U.S. Pat. No. 5,552,919, the invention derives the control signal for the tunable first filter by modulating the first optical signal, or at least a part of it, before being applied to the first filter.

The first optical signal is preferably frequency or wavelength modulated, preferably in a frequency/wavelength range of at least a few percent of the FWHM (Full Width Half Maximum) frequency span of the underlying first filter characteristic.

Preferably, a second optical signal is applied to be filtered by the first filter.

In a first preferred embodiment, an initial optical signal is split up, divided or otherwise separated into the first signal and the second (preferably a part in a range of 95% of the initial optical signal) signal. The second signal is travelling to the first filter, and the first signal will be modulated with the modulation signal by a modulation unit before being applied to the first filter.

While the modulated first signal can be provided to the first filter having the same propagation direction as the second signal, it is preferred to direct the modulated first signal to the first filter with propagation direction opposite to the second signal. In the latter case, adequate direction controllers, such as circulators or beam-splitters, are provided, preferably before and after the first filter (with respect to the propagation direction of the second signal). Thus, the modulated first signal can be passed through the first filter with opposite propagation direction as the second signal, and can be coupled out after passing the first filter without adversely affecting the source(s) of the optical signal(s).

Such separation of propagation directions for the second signal and the modulated first signal allows that the second signal will not be affected by the modulation, thus avoiding the disadvantage in the aforementioned U.S. Pat. No. 5,552,919 that the (main) optical signal is also modulated after passing the first filter. Preferably when coupling out only a small fraction for the first signal, the second signal substantially representing the optical signal will only be filtered as desired but not be subjected to additional noise as resulting from the modulation.

In one embodiment, the incoming optical signal is split up by a first beamsplitter into the second signal directly applied to the first filter and the first signal to be modulated. A second beam splitter is provided after the first filter (with respect to the second signal) in a way that the filtered second signal will be coupled out by the second beam splitter while the modulated first signal provided at a different input of the second beamsplitter than the filtered second signal, so that the modulated first signal will be applied to the first filter with opposite propagation direction than the second signal. After passing the first filter, the filtered modulated first signal will be coupled out by the first beamsplitter.

In a second embodiment, the first and second beamsplitters are provided as polarization dependent beamsplitters, so that the first and second signals travel with different states of polarization. This allows clearly separating the signals, so that e.g. an unwanted coupling back of the filtered modulated first signal to the source of the incoming optical signal can be efficiently avoided.

In a further embodiment wherein a wavelength or frequency modulation (in the following referred to as only frequency modulation) is applied, the filtered modulated signal is converted into an electrical signal, preferably by detecting the optical power e.g. using a photodetector. The electrically converted filtered modulated signal together with the modulation signal are provided to an analyzer unit for deriving the control signal. Various algorithms or methods for further signal processing, as known in the art, can be applied for achieving the control signal therefrom. Preferably, a Lock-In Amplifier can be applied for generating the desired control signal.

By modulating the optical signal (instead of modulating the first filter characteristic), the invention allows to achieve significantly higher control speed for tuning the first filter. This is due the fact that in such control circuits as preferably applied the lower limit of the response time of the control signal is given by the inverse of the modulation frequency. Since modulation frequencies for optical signals can easily be in the order of a few GHz, the method allows for faster response times compared to systems, where the modulation is attained by the motion of moveable parts.

In a second preferred embodiment, the first optical signal (to be modulated) and the second optical signal (to be filtered only) are substantially independent from each other. This is in contrast to the first preferred embodiment wherein the first and second signals are both derived from an initial optical signal. In both cases, however, the first signal represents the optical signal to adjust the characteristic of the first filter to, so that the characteristic of first filter will be adjusted to the first signal.

In one embodiment of the second preferred embodiment, the first and second signals are first filtered by a preset filter preset to a desired wavelength, before being modulated and/or filtered by the first filter. Preferably, the first and second signals are provided to the preset filter in opposite propagation directions. Thus, the first filter will 'automatically' follow the wavelength setting of the preset filter. This setup allows e.g. for setting up an optical spectrum analyzer, where the unwanted transverse modes of optical filters can be strongly suppressed, if the filter characteristics of the two optical filters are chosen to have a different transverse mode spectrum. It is clear that the invention, in particular for deriving the control signal, can be embodied or supported by one or more suitable software programs, which can be stored on or otherwise provided by any kind of data carrier, and which might be executed in or by any suitable data processing unit.

BRIEF DESCRIPTION OF THE DRAWINGS

Other objects and many of the attendant advantages of the present invention will be readily appreciated and become better understood by reference to the following detailed description when considering in connection with the accompanied drawings. Features that are substantially or functionally equal or similar will be referred to with the same reference sign(s).

FIGS. 2A and 2B show preferred embodiments for the optical path as of FIG. 1.

DETAILED DESCRIPTION OF THE INVENTION

Figure 1:
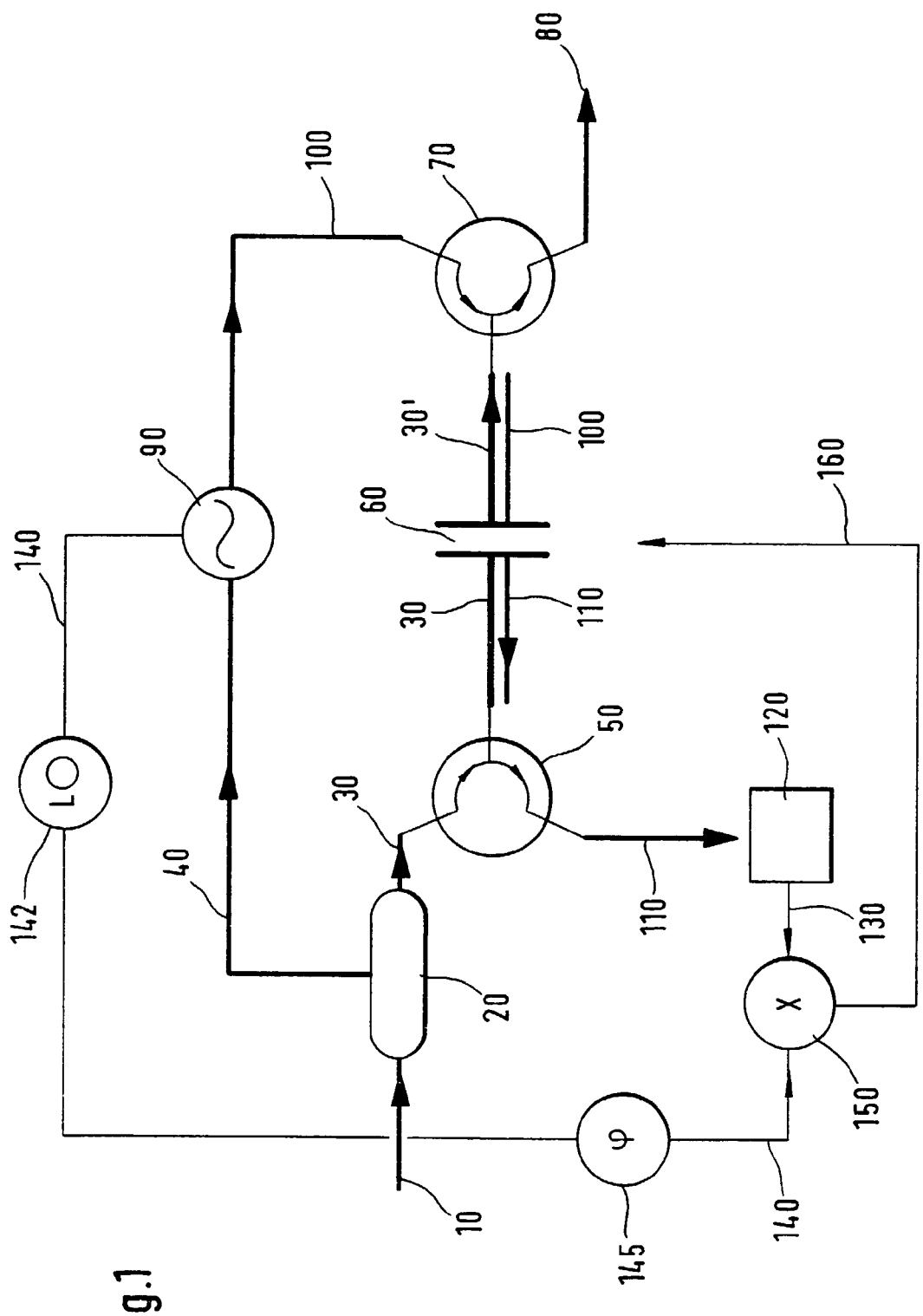
FIG. 1 illustrates a first preferred embodiment according to the present invention.

In FIG. 1, an incoming optical signal 10 is split a by a splitting device 20 into a second optical signal 30 and a first optical signal 40. The second optical signal 30 is directed via a direction controller 50 to a first filter 60, and a filtered second optical signal 30' is applied to a second direction controller 70 and coupled out as an output signal 80.

The first optical signal 40 is directed to a modulation unit 90 providing a frequency modulation thereto. A modulated first optical signal 100 is directed via the second direction controller 70 to the first filter 60, however, travelling through the first filter 60 with opposite propagation direction then the second optical signal 30. A filtered modulated first optical signal 110 is directed by the first direction controller 50 to a photodetector 120 converting the filtered modulated first optical signal 110 into an (electrical) modulated signal 130.

A modulation signal 140 (generated e.g. by a local oscillator 142), as provided to the modulation unit 90 for modulating the first optical signal 40, is received together with the modulated signal 130 by an analysis unit 150. An optional phase shifting device 145 can be applied for phase adjustment of the modulation signal 140. The analysis unit 150 derives a control signal 160 by analyzing the modulation signal 140 together with the modulate signal 130. The control signal 160 is then applied to the first filter 60 for tuning its filter characteristic in wavelength, so that a maximum in the filter characteristic of the first filter 60 matches with the wavelength of the optical signal 10 or the therefrom derived second optical signal 30.

The term "wavelength of the optical signal" has to be interpreted here in its broadest sense and shall cover in particular a spectral peak of or in the optical signal. However, when applying adequate algorithms for deriving the control signal, the first filter always adjusts its center wavelength to the spectral peak.

In FIG. 2A, the splitter 20 and the first direction controller 50 of FIG. 1 are embodied as a first beamsplitter 250A. Correspondingly, the second direction controller 70 is embodied as a second beamsplitter 270A. Thus, the optical signal 10 is split by the first beamsplitter 250A into the second optical signal 30 and the first optical signal 40. The returning filtered modulated first optical signal 110 is split by the first beam splitter 250A into the beam 110A directed towards the photodetector 120 but also into a portion 110B propagating into the direction of the source of the optical signal 10. The second beamsplitter 270A splits the modulated first optical signal 100 into the beam 100A directed towards the first filter 60 and a beam 100B. Correspondingly, the filtered second optical signal 80 is split by the second beamsplitter 270A into the beams 80A and 80B, with beam 80B propagating towards the modulation unit 90 with opposite propagation direction than the beam 100.

In FIG. 2B, the beamsplitter 250A and 270A are replaced by polarization dependent beamsplitters 250B and 270B in order to clearly separate the modulated and the unmodulated optical signals. The polarization of the incoming optical signal 10 is adjusted with respect to the s (indicated as a point e.g. for the first beam 40) and p (indicated as an arrow e.g. for the output beam 80) polarization orientation of the beamsplitter 250A that the desired fraction ratio between the intensities of the signals 30 and 40 is obtained. Beamsplitter 270A can now be oriented to couple a desired fraction of signal 100 back into the first filter 60, respectively a desired fraction of signal 80 into the output.

A preferred mathematical model for deriving the control signal from the modulation signal and the filtered modulated signal shall now be illustrated in detail.

Figure 3:
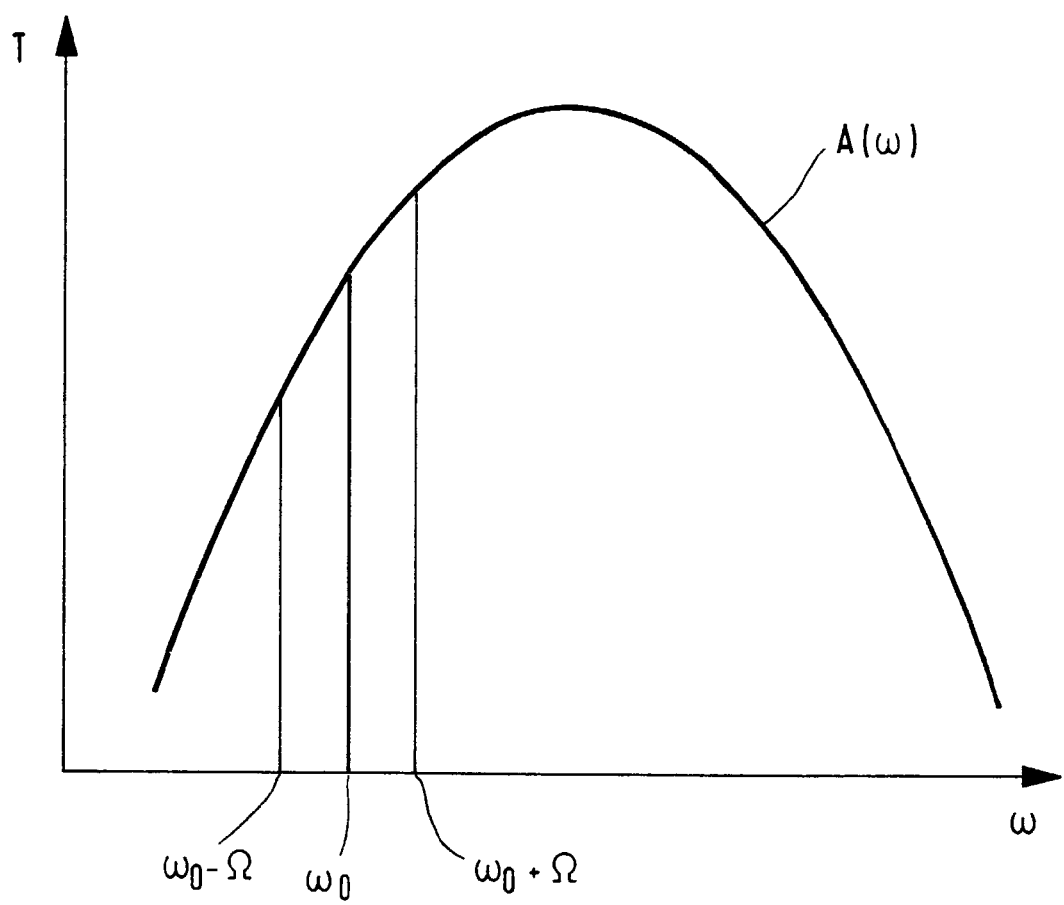
FIG. 3 illustrates a preferred algorithm for deriving the control signal.

FIG. 3 shows a schematic first filter curve represented by the function $A(\omega)$, where T is the transmission and $\omega$ is a frequency in the optical range. If a monochromatic lightwave, having frequency $\omega$, is tuned across the first filter characteristic and subsequently detected by a photodetector, the detector signal $S_D$ is given by the following equation:

$$S_D(\omega) = k \cdot A(\omega), \tag{1}$$

where k is a constant, describing the detector properties. The detector response is calculated for frequency modulated light, which is modulated with a frequency $\Omega$ and a modulation amplitude $\Delta_m$. For this type of light the time dependent optical frequency is:

$$\omega(t) = \omega_0 + \Delta_m \cos(\Omega t), \tag{2}$$

The function $A(\omega)$ then exhibits a time dependency and can be expanded in a Taylor series, which can be truncated after the first order for small modulation amplitudes $\Delta_m$:

$$A(\omega, t) \approx A(\omega_0) + \left.\frac{\partial A}{\partial \omega}\right|_{\omega_0} \cdot \Delta_m \cos(\Omega t) + \ldots . \quad (3)$$

Inserting equation (3) into equation (1) and allowing for a general phase $\phi$ in the detector response leads to the approximated time varying detector signal:

$$S_D(t) = k \cdot \left[A(\omega_0) + \left.\frac{\partial A}{\partial \omega}\right|_{\omega_0} \cdot \Delta_m \cos(\Omega t = \varphi)\right]. \quad (4)$$

Now this signal can be mixed with a reference signal of the form $$S_{Ref} = B \cdot \cos(\Omega t), \quad (5)$$

where B is an arbitrary amplitude. The mixing result of eqs. (4) and (5) is as follows:

$$S_D \cdot S_{Ref} = B \cdot k \cdot \left[A(\omega_0) \cdot \cos(\Omega t) + \frac{1}{2}\left.\frac{\partial A}{\partial \omega_0}\right|_{\omega_0} \Delta_m \cos(2\Omega t + \varphi)\frac{1}{2}\left.\frac{\partial A}{\partial \omega_0}\right|_{\omega_0} \right. \quad (6)$$

$$\left. \Delta_m \cos\varphi\right].$$

Filtering the mixing signal of equation (6) by means of a low pass filter, which transmits only frequencies smaller than $\Omega$, one obtains $$S_{Filter} = B \cdot k \left[\frac{1}{2}\left.\frac{\partial A}{\partial \omega_0}\right|_{\omega_0} \Delta_m \cos\varphi\right]. \quad (7)$$

Since (7) is proportional to the first derivative of A with respect to $\omega$, it can be readily used as control signal 160 for the optical first filter 60. Appropriate adjustment of the phase $\phi$ allows for setting the sign of the signal, respectively allows for maximizing it.

Figure 4:
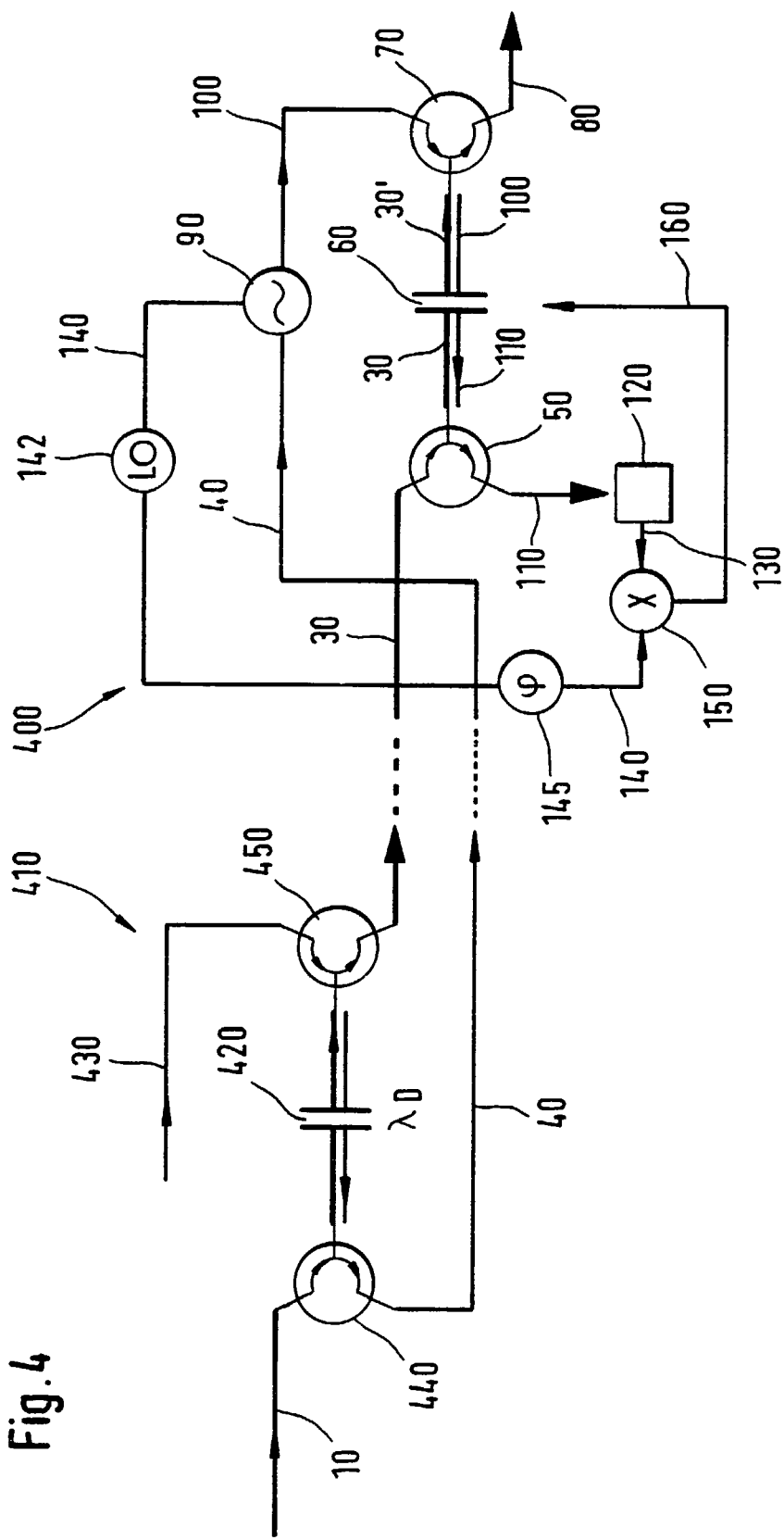
FIG. 4 illustrates a second preferred embodiment according to the present invention.

FIG. 4 illustrates a second embodiment of the present invention. Whereas FIGS. 1–2 derive the first optical signal 40 from the initial signal 10, the first optical signal 40 in the embodiment of FIG. 4 is independent from the initial signal 10. In any case, the first optical signal 40 represents the optical signal to adjust the characteristic of the first filter 60 to. Circuit 400 as the right part of FIG. 4 therefore substantially corresponds with FIG. 1, however already starting with the first and second optical signals 40 and 30.

The circuit 400 also works in accordance with FIG. 1, so that the characteristic of first filter 60 will be adjusted to the first optical signal 40 (i.e. the characteristic of the first filter 60 matches with the first optical signal 40) as illustrated above.

Circuit 410—as the left part of FIG. 4—illustrates a specific example for generating the first and second optical signals 40 and 30 to be applied then to the right part of FIG. 4, as explained above. In the circuit 410, a preset filter 420 is preset to a desired wavelength $\lambda_D$. The optical input signal 10 is filtered according to the filter characteristics of the preset filter 420. The reverse path through the preset filter 420 is illuminated by a beam 430, preferably provided by an optical broadband source. The filtered beam 430 represents the first optical signal 40 and exhibits the characteristics of the preset filter 420. Direction controllers 440 and 450 can be applied as explained above.

The first optical signal 40 is now frequency modulated and can be fed through the reverse path of the first filter 60. The detection scheme then just follows the procedure already discussed above. Thus, first filter 60 will 'automatically' follow the wavelength setting $\lambda_D$ of the preset filter 420.

This setup of FIG. 4 allows e.g. for setting up an optical spectrum analyzer, where the unwanted transverse modes of optical filters can be strongly suppressed, if the filter characteristics of the two optical filters 420 and 60 are chosen to have a different transverse mode spectrum.

In case of an application of FIG. 4 as optical spectrum analyzer, the optical input signal 10 represents the signal to by analyzed. The beam 430 is provided by an optical broadband source in order to ensure that the first optical signal 40 with wavelength setting $\lambda_D$ will be present (even if the optical input signal 10 does not contain that setting $\lambda_D$).

What is claimed is:

1. A system for matching an optical filter characteristic of a first filter tunable in wavelength with an initial optical signal, comprising:
   a first splitting device for splitting up the initial optical signal into first and second optical signals;
   a modulator for frequency or wavelength modulating at least a part of the first optical signal with a modulation signal before being applied to the first filter, wherein the second optical signal is applied to the first filter without being modulated by the modulation signal; and
   an analyzing unit adapted for deriving a control signal for tuning the first filter by analyzing the modulated first optical signal after passing the first filter in conjunction with the modulation signal.

2. The system of claim 1, wherein the modulator modulates the first optical signal in a frequency or wavelength range of at least a portion of a Full Width Half Maximum frequency span of the optical filter characteristic.

3. A system for matching an optical filter characteristic of a first filter tunable in wavelength with a first optical signal, comprising:
   a first splitting device for splitting up an initial optical signal into the first optical signal and a second optical signal;
   a modulator adapted for modulating at least a part of the first optical signal with a modulation signal before being applied to the first filter; and
   an analyzing unit adapted for deriving a control signal for tuning the first filter by analyzing the modulated first optical signal after passing the first filter in conjunction with the modulation signal,
   wherein the second optical signal is applied to the first filter without being modulated by the modulation signal.

4. A system for matching an optical filter characteristic of a first filter tunable in wavelength with a first optical signal, comprising:
   a modulator adapted for modulating at least a part of the first optical signal with a modulation signal before being applied to the first filter;
   an analyzing unit adapted for deriving a control signal for tuning the first filter by analyzing the modulated first optical signal after passing the first filter in conjunction with the modulation signal; and a first direction controller for providing the modulated first optical signal and a second optical signal to the first filter with opposite propagation directions, wherein the second optical signal is not modulated with the modulation signal.

5. The system of claim 4, wherein the first direction controller comprises a beamsplitter.

6. The system of claim 5, wherein the beamsplitter comprises a polarization dependent beamsplitter.

7. A system for matching an optical filter characteristic of a first filter tunable in wavelength with a first optical signal, comprising:

a modulator adapted for modulating at least a part of the first optical signal with a modulation signal before being applied to the first filter; and an analyzing unit adapted for deriving a control signal for tuning the first filter by analyzing the modulated first optical signal after passing the first filter in conjunction with the modulation signal, wherein a second optical signal is applied to the first filter without being modulated with the modulation signal, and wherein the first optical signal to be modulated and the second optical signal applied to the first filter are substantially independent from each other, and the system further includes:

a preset filter preset to a desired wavelength ($\lambda_D$) and adapted to filtering the first optical signal and the second optical signal before being filtered by the first filter.

8. An optical spectrum analyzer, comprising a system of claim 7.

9. A method for matching an optical filter characteristic of a first filter tunable in wavelength with an initial optical signal, comprising:

splitting the initial optical signal into first and second optical signals;

frequency or wavelength modulating at least a part of the first optical signal with a modulation signal;

applying the modulated first optical signal and the second optical signal to the first filter, such that the second optical signal is not modulated by the modulation signal; and deriving a control signal for tuning the first filter by analyzing the modulated first optical signal after passing the first filter in conjunction with the modulation signal.

10. The method of claim 9, wherein frequency or wavelength modulating at least a part of the first optical signal with a modulation signal comprises modulating at least a part of the first optical signal in a frequency/wavelength range of at least a portion of a Full Width Half Maximum frequency span of the characteristic of the first filter.

11. A method for matching an optical filter characteristic of a first filter tunable in wavelength with a first optical signal, comprising:

applying the first optical signal to a preset filter preset to a desired wavelength ($\lambda_D$);

modulating at least a part of the first optical signal filtered by the preset filter with a modulation signal;

applying the modulated first optical signal to the first filter;

deriving a control signal for tuning the first filter by analyzing the modulated first optical signal after passing the first filter in conjunction with the modulation signal;

applying a second optical signal that is not modulated with the modulation signal to the preset filter preset to the desired wavelength ($\lambda_D$); and applying the second optical signal filtered by the preset filter to the first filter, wherein the first optical signal and the second optical signal are substantially independent from each other.

* * * * *